(12) United States Patent
Buettner et al.

(10) Patent No.: US 8,422,313 B2
(45) Date of Patent: Apr. 16, 2013

(54) REDUCED POWER CONSUMPTION MEMORY CIRCUITRY

(75) Inventors: Stefan Buettner, Sindelfingen (DE); David A. Hrusecky, Cedar Park, TX (US); Werner Juchmes, Boeblingen (DE); Wolfgang Penth, Holzgerlingen (DE); Rolf Sautter, Bondorf (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/284,480

(22) Filed: Oct. 28, 2011

(65) Prior Publication Data

US 2012/0155188 A1    Jun. 21, 2012

(30) Foreign Application Priority Data

Dec. 16, 2010 (EP) ..................... 10195298

(51) Int. Cl.
*G11C 7/10* (2006.01)
*G11C 7/00* (2006.01)

(52) U.S. Cl.
USPC ..................... 365/189.02; 365/191

(58) Field of Classification Search .......... None
See application file for complete search history.

(56) References Cited

U.S. PATENT DOCUMENTS

| | | | |
|---|---|---|---|
| 5,668,761 A | 9/1997 | Muhich et al. | |
| 6,105,123 A * | 8/2000 | Raje | 712/24 |
| 6,657,886 B1 | 12/2003 | Adams et al. | |
| 6,711,051 B1 | 3/2004 | Poplevine et al. | |
| 7,272,061 B2 | 9/2007 | Saleh | |
| 7,301,793 B2 | 11/2007 | Kanehara et al. | |
| 2004/0105299 A1 | 6/2004 | Joshi | |
| 2008/0310207 A1 | 12/2008 | Tan et al. | |
| 2009/0303821 A1 | 12/2009 | Arsovski et al. | |
| 2011/0007580 A1* | 1/2011 | Houston et al. | 365/189.15 |

OTHER PUBLICATIONS

Amrutur, Bharadwaj S. et al., "Speed and Power Scaling of SRAM's", IEEE Transactions on Solid-State Circuits, vol. 35, No. 2 Feb. 2000, pp. 175-185.

Karandikar, Ashish et al., "Low Power SRAM Design using Hierarchical Divided Bit-Line Approach", Computer Design: VLSI in Computers and Processors, 1998. ICCD '98. Proceedings. International Conference on Oct. 5-7, 1998, pp. 82-88.

Kuang, Jente B. et al., "The Design and Characterization of a Half-Volt 32nm Dual-Read 6T SRAM", Jul. 5, 2011, 8 pages.

* cited by examiner

*Primary Examiner* — Hoai V Ho
*Assistant Examiner* — James G Norman
(74) *Attorney, Agent, or Firm* — DeLizio Gilliam, PLLC

(57) ABSTRACT

In a circuit that reduces power consumption in an array system of memory cells accessible in parallel, a local evaluation circuit is connected to a memory cell and a global bit line of the array system of memory cells. A selection circuitry splits the global bit line into an upper part and a lower part of the global bit line. The selection circuitry is adapted to receive an early set prediction signal and to connect the upper part of the global bit line to the lower part of the global bit line based on the early set prediction signal. The early set prediction signal indicates whether a set of memory cells, which include the memory cell, is being read. The circuit also includes a N:1 multiplexer connected to the lower part of the global bit line to receive the lower part of the global bit line as input.

20 Claims, 4 Drawing Sheets

US 8,422,313 B2

REDUCED POWER CONSUMPTION MEMORY CIRCUITRY

CROSS-REFERENCE TO RELATED MATTERS

This patent application claims benefit of priority under 35 U.S.C. §119(a) of European Patent Application EP10195298, which was filed on Dec. 16, 2010.

BACKGROUND

Embodiments of the present inventive subject matter relate in general to the field of digital memory circuits, and in particular to reduced power consumption in memory.

Static random access memory (SRAM) is a type of volatile digital memory that retains data written to it so long as power is applied to the SRAM. One type of SRAM commonly used in high performance computational circuits is referred to as a "domino" SRAM.

Cells in a domino SRAM design are arranged into groups of cells, typically on the order of eight to sixteen cells per group. Each cell in a group is connected to a local bit line pair. The local bit line pair for each group of cells is coupled to a global bit line pair. Rather than use a sense amplifier to detect a differential voltage when reading a cell, the local bit lines in a domino SRAM are precharged and discharged by the cell in a read operation. The discharge is detected and determines the state of cell. The local bit line, the precharge circuitry, and the detection circuitry define a dynamic node of the domino SRAM.

FIG. 5 depicts a ripple domino read scheme of an SRAM cell 12.1. Referring to FIG. 5, a read operation starts with a rising word line at the SRAM cell 12.1. The SRAM cell 12.1 pulls down the local bit line (lbl) 16. The local bit line 16 is connected to a local evaluation circuit 14, which acts as an amplifier for the read signal. The local evaluation circuit 14 comprises an amplifier and gate controlled by a read enable signal rdt. Also the local evaluation circuit 14 comprises a pull-down-NFET 14.2 controlled by a signal dt to pull down a global bit line gbl' which is a high capacity node due to the long wiring length and the device capacitance of the local evaluation circuit pull-down devices. The global bit line gbl' is the biggest contributor for active and passive power consumption in ripple domino SRAM arrays.

The SRAM cells 12.1 on the word line are read out all at the same time in spite of the fact that only the information of one set is needed at the output. For a data cache using a given number of N global bit lines gbl', only one of the N possibly discharged global bit lines gbl' is read out. A N:1-way multiplexer 22 is used to choose the global bit line gbl' to read based on a control signal. Further, a global bit line restore and latch device 40' is used to charge the global bit line gbl' which comprises a pull-up-PFET 42', a latch 44' and an inverter 46'. Additionally a redundancy multiplexer 30' is used to decide which global bit line is fed as input signal into the N:1-way multiplexer 22 based on a defect signal indicating whether the global bit line gbl' is found to be defective or not defective. The global bit line gbl' is the output signal muxed_gbl' of the redundancy multiplexer 30' if the global bit line gbl' is found to not be defective, and a redundant global bit line gbl+2' is used as the output signal muxed_gbl' of the redundancy multiplexer 30' if the global bit line gbl' is found to be defective. The global bit lines, which are the main contributor to power consumption, are charged every cycles to the level of the power supply voltage.

SUMMARY

In a circuit that reduces power consumption in an array system of memory cells accessible in parallel, a local evaluation circuit is connected to a memory cell and a global bit line of the array system of memory cells. A selection circuitry splits the global bit line into an upper part and a lower part of the global bit line. The selection circuitry is adapted to receive an early set prediction signal and to connect the upper part of the global bit line to the lower part of the global bit line based on the early set prediction signal. The early set prediction signal indicates whether a set of memory cells, which include the memory cell, is being read. The circuit also includes a N:1 multiplexer connected to the lower part of the global bit line to receive the lower part of the global bit line as input.

Accordingly, in an embodiment of the present inventive subject matter, a circuit arrangement for reducing power consumption in an array system of SRAM cells, which accesses all sets of SRAM cells in a SRAM cell bank in parallel, is located to split a global bit line in an upper part and a lower part. The circuit arrangement is connected to a local evaluation circuit by a first line forming an upper part of the split global bit line. The circuit arrangement is also connected to a N:1-way multiplexer, which selects a set of SRAM cells to read, by a second line forming the lower part of the split global bit line. The circuit arrangement receives an early set prediction signal indicating whether an associated set of SRAM cells is to be read or won't be read. At least one of the following is performed in accordance with said early set prediction signal: 1) connecting the upper part of the split global bit line to the lower part of the split global bit line if the associated set of SRAM cells is to be read; and 2) isolating the upper part of the split global bit line from the lower part of the global bit line if the associated set of SRAM cells is not to be read.

In further embodiments of the present inventive subject matter, the circuit arrangement is connected to the local evaluation circuit by a third line forming an alternative upper part of the split global bit line. The circuit arrangement receives a defect signal indicating whether the first line is found to be defective or is found to not be defective. The first line is used as the upper part of the split global bit line if the first line is found to not be defective; and the third line is used as the upper part of the split global bit line if the first line is found to be defective.

In further embodiments of the present inventive subject matter, the circuit arrangement comprises at least one NFET (Negative Field Effect Transistor) as a passgate device used to connect or isolate the upper part and the lower part of the split global bit line.

In further embodiments of the present inventive subject matter, the circuit arrangement comprises at least one PFET (Positive Field Effect Transistor) forming a full transmission gate with the at least one NFET (Negative Field Effect Transistor) enabling a full pre-charge of the split global bit line.

In further embodiments of the present inventive subject matter, the circuit arrangement comprises a first NFET (Negative Field Effect Transistor) as a first passgate device used to connect or isolate the first line as the upper part of the split global bit line and the second line as the lower part of the split global bit line, and a second NFET (Negative Field Effect Transistor) as a second passgate device used to connect or isolate the third line as the upper part of the split global bit line and the second line as the lower part of the split global bit line.

In further embodiments of the present inventive subject matter, a first PFET (Positive Field Effect Transistor) forms a full transmission gate with the first NFET (Negative Field Effect Transistor), enabling a full precharge of the first line as the upper part of the split global bit line. In addition, a second PFET (Positive Field Effect Transistor) forms a full transmission gate with the second NFET (Negative Field Effect Transistor), enabling a full precharge of the third line as the upper part of the split global bit line.

In another embodiment of the present inventive subject matter, an array system of SRAM cells, which accesses all sets of SRAM cells in a SRAM cell bank in parallel, comprises at least one core of SRAM cells, at least one local evaluation circuit, at least one redundancy multiplexer, at least one restore and latch device, and a N:1-way multiplexer. The at least one redundancy multiplexer is formed as a circuit arrangement for reducing power consumption in an array system of SRAM cells as described above.

In further embodiments of the present inventive subject matter, the redundancy multiplexer is located between the local evaluation circuit and the restore and latch device.

In further embodiments of the present inventive subject matter, the N:1-way multiplexer is used to select a set of SRAM cells to be read.

In further embodiments of the present inventive subject matter, the restore and latch device is used to keep or restore a corresponding logic level of the lower part of the global bit line.

In another embodiment of the present inventive subject matter, a SRAM device comprises at least one array system of SRAM cells as described above.

All in all, embodiments of the inventive subject matter address the reduction of power consumption in an array of Static Random Access Memory (SRAM) cells. Embodiments of the inventive subject matter are based on the idea of splitting the global bit line and introducing an early set prediction signal containing information on whether the associated set of SRAM cells might be read, or won't be read. The early set prediction signal is fed into the circuit arrangement for reducing the power consumption which is used as redundancy multiplexer in an array system of SRAM cells.

According to the inventive subject matter, the circuit arrangement employing the redundancy function has not only the function to decide on which upper part is connected with the lower part to build the corresponding global bit line based on a defect signal indicating whether a corresponding upper part of the global bit line is found to be defective or is found to not be defective. Due to the split constitution of the global bit line, the redundancy multiplexer is able to fully isolate the upper part from the lower part of the global bit line. Only a part of the global bit line will be charged up depending on the set prediction information from the early set prediction signal. If the set prediction information is available at a very early point in time, then it is possible to prevent charging bit lines connected to cells not being read in the next read process before the global bit line multiplexer is activated. If the set prediction information is available after the global bit line multiplexer is activated, then it is possible to prevent the bit lines connected to cells not being read in the next read process from fully discharging during the read process.

Further, positions of restore and latch devices and a redundancy multiplexer are swapped so that only the lower part of the selected global bit line has to be restored or kept on the precharged level since lower parts of unselected global bit lines are isolated from the corresponding upper parts of the unselected global bit lines. Since the circuit arrangement gates the global bit line, only a part of the global bit line is precharged and therefore a reduction in power consumption is achieved.

Further, the circuit arrangement may be changed from full transmission gate with at least one NFET-Transistor and at least one PFET-Transistor to a NFET-passgate just comprising at least one NFET-Transistor, so the upper part of the global bit line above the redundancy multiplexer will be only precharged to a voltage level which is lower than a supply voltage level. This enables active power saving at every precharge action as the upper part of the global bit line above the passgate will only be precharged to the reduced voltage level instead of the full supply voltage level. This saves a lot of power in the array system of SRAM cells. This also reduces leakage as the Drain-Source voltage of the bit line pull-down devices is reduced. Also, the SRAM read operation is sped up as the global bit line discharge will be faster if the voltage swing is reduced.

Alternatively, a "Chicken Switch" option may be realized by adding at least one PFET-Transistor to build up a full transmission gate. The PFET-Transistors may be controlled by a control signal which enables a full precharge of the global bit line to the supply voltage level if desired.

In other words, embodiments of the inventive subject matter combine a redundancy multiplexer function with a power saving feature for the global bit line. Only a part of the global bit line will be charged up, depending on the set prediction information and without additional requirements for the signals feeding into the N:1-way multiplexer selecting a global bit line to read based on a late selecting signal. Also, the global bit line restore signal is as fast as it used to be.

In an implementation of the present inventive subject matter comprising the power saving redundancy multiplexer and the restore and latch device, the redundancy multiplexer is controlled by the early set prediction signal. The early set prediction signal is associated with set information not needed in the current cycle, thus allowing the precharge of the lower part of global bit lines not selected to be avoided. Or use of the early set prediction signal avoids the discharge of the upper part of the global bit lines not selected.

BRIEF DESCRIPTION OF THE DRAWINGS

The present embodiments may be better understood, and numerous objects, features, and advantages made apparent to those skilled in the art by referencing the accompanying drawings.

DETAILED DESCRIPTION

Figure 1:
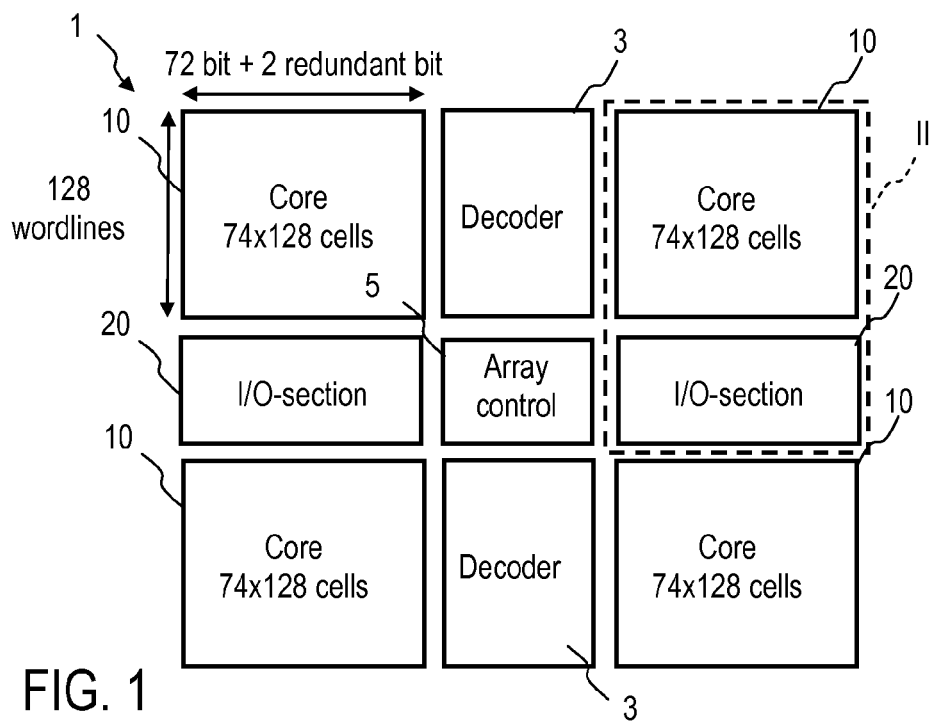
FIG. 1 is a schematic block diagram of a SRAM array system, in accordance with an embodiment of the inventive subject matter.
Figure 2:
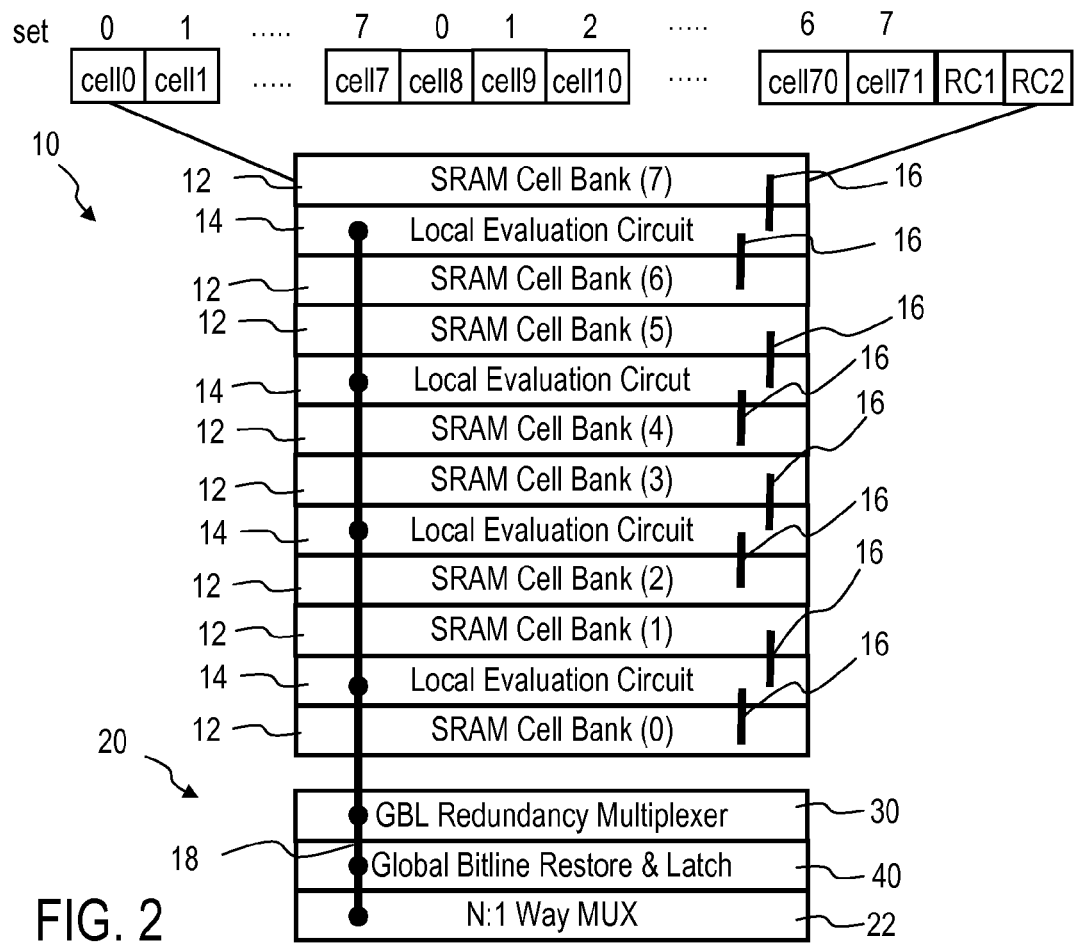
FIG. 2 is a more detailed block diagram of a part of the SRAM array system shown in FIG. 1, in accordance with an embodiment of the inventive subject matter.

FIG. 1 is a schematic block diagram of a SRAM array system 1, in accordance with an embodiment of the present inventive subject matter, and FIG. 2 is a more detailed block diagram of a part of the SRAM array system shown in FIG. 1, in accordance with an embodiment of the present inventive subject matter. For the sake of simplicity, only the upper right part 11 of the SRAM array system 1 is shown in detail herein. The shown array system 1 may be used in a SRAM device in a P-Data cache, for example.

Referring to FIG. 1, the shown embodiment of the SRAM array system 1 accesses all sets of SRAM cells in a SRAM cell bank in parallel and comprises four SRAM cell cores 10, each comprising 128 word lines, 72 bit lines, and 2 redundant bit lines. Thus, each cell core 10 comprises 74×128 SRAM cells. At intersections of the word lines and the bit lines, the system 1 comprises two decoder sections 3, two Input/Output (I/O) sections 20 and an array control section 5.

Referring to FIG. 2, in the shown embodiment each SRAM cell core 10 comprises eight SRAM cell banks (0 . . . 7) 12. Each SRAM cell bank 12 comprises sixteen word lines, each of which comprises 72 SRAM cells (cell0-cell71) and two additional redundancy SRAM cells RC1, RC2 per word line arranged in eight sets 0-7. Each set comprises eight of the SRAM cells cell0-cell71. Each SRAM cell bank 12 is connected to a corresponding local evaluation circuit 14 by local bit lines (lbl) 16, wherein each local evaluation circuit 14 is connected with two SRAM cell banks 12 so that each SRAM cell core 10 comprises four local evaluation circuits 14. The local evaluation circuits 14 are used to condition the dynamic write data being written to the SRAM cells, cell-cell71, and the read data read from the SRAM cells, cell0-cell71 by using different local read lines and/or local write enable lines. The local evaluation circuits 14 include a top half and a bottom half, which are reflected copies of each other. Each half includes circuitry used to precharge the local bit line pair used to write to or read from die SRAM cells.

Still referring to FIG. 2, in the shown embodiment each I/O section comprises a global bit line redundancy multiplexer 30, a global bit line restore and latch device 40 and an N:1-way multiplexer 22. During a read process, all 72 SRAM cells cell0 . . . cell71 of a selected word line are read concurrently, independent from the corresponding set. But the N:1-way multiplexer 22 selects only one set for further processing. That means only the information of those of cells cell0 . . . cell71 belonging to the selected set is read out for further processing.

Figure 3:
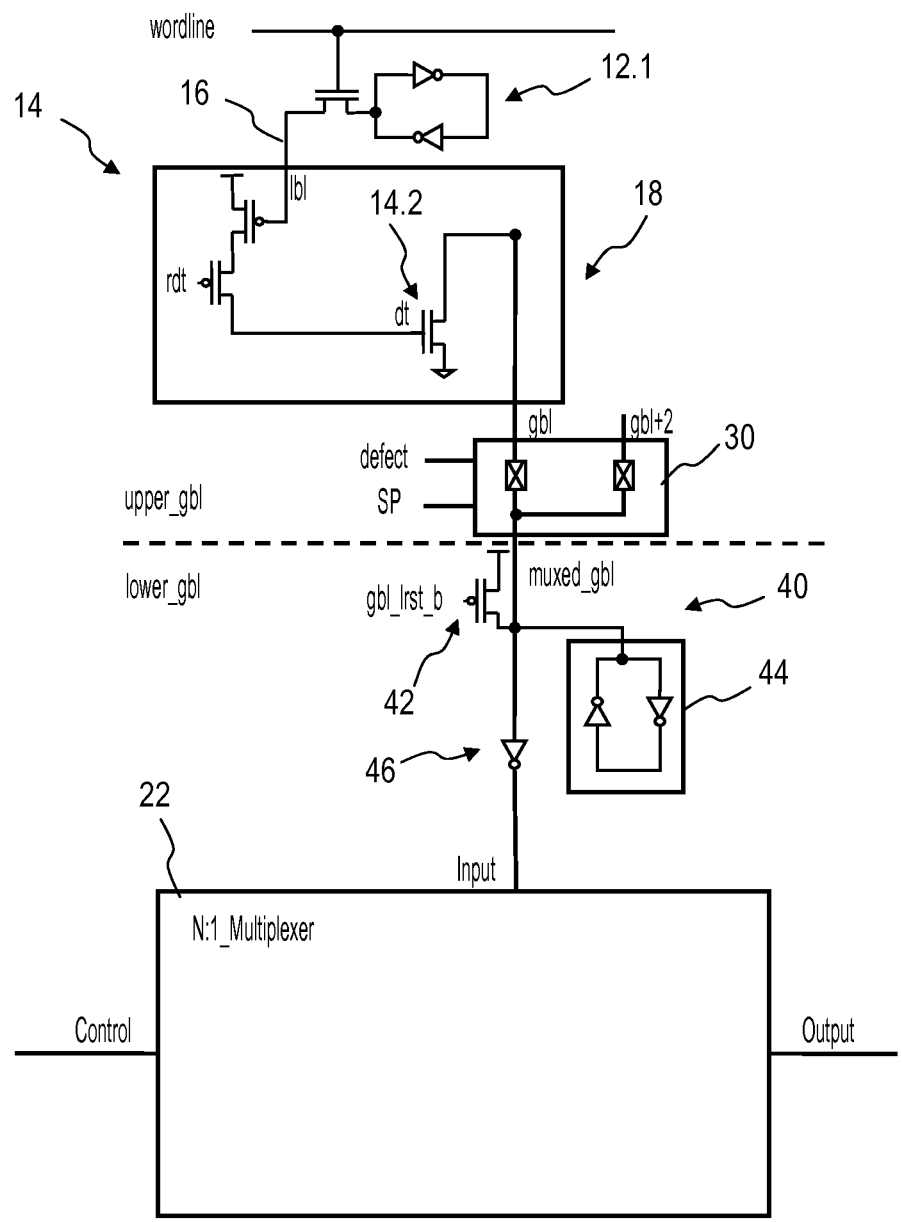
FIG. 3 is a schematic diagram of a read scheme of a SRAM cell of the SRAM array shown in FIG. 1 or 2, in accordance with an embodiment of the inventive subject matter.
Figure 4:
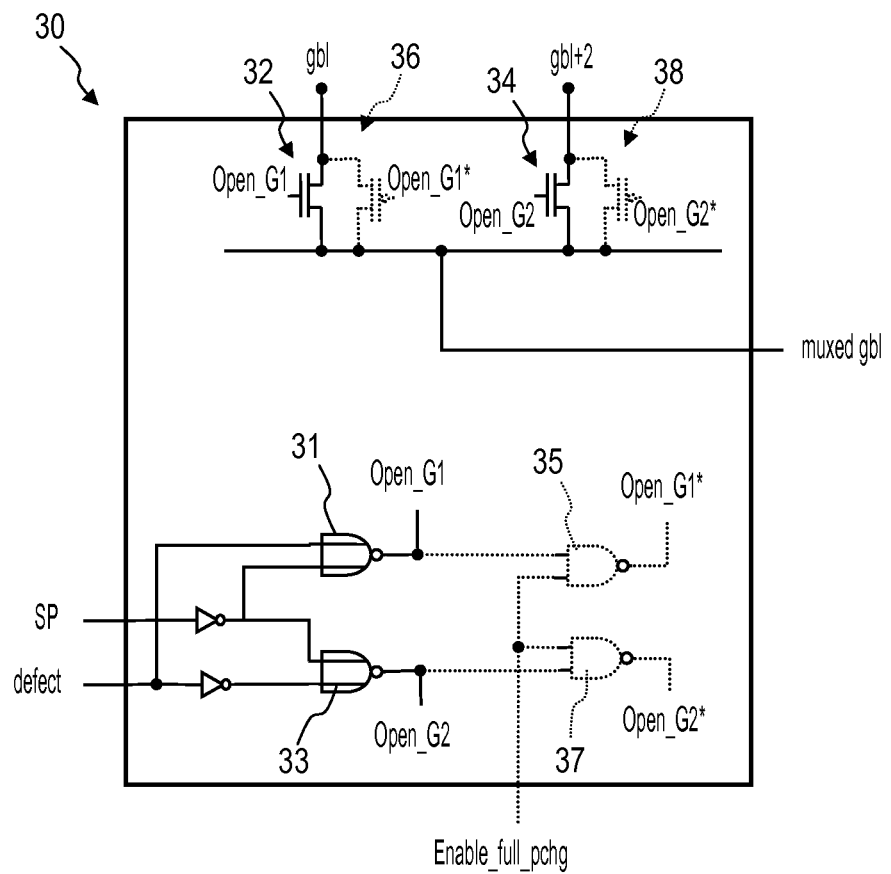
FIG. 4 is a schematic diagram of a circuit arrangement for reducing the power consumption in an SRAM array system shown in FIGS. 1 to 3, in accordance with an embodiment of the inventive subject matter.
Figure 5:
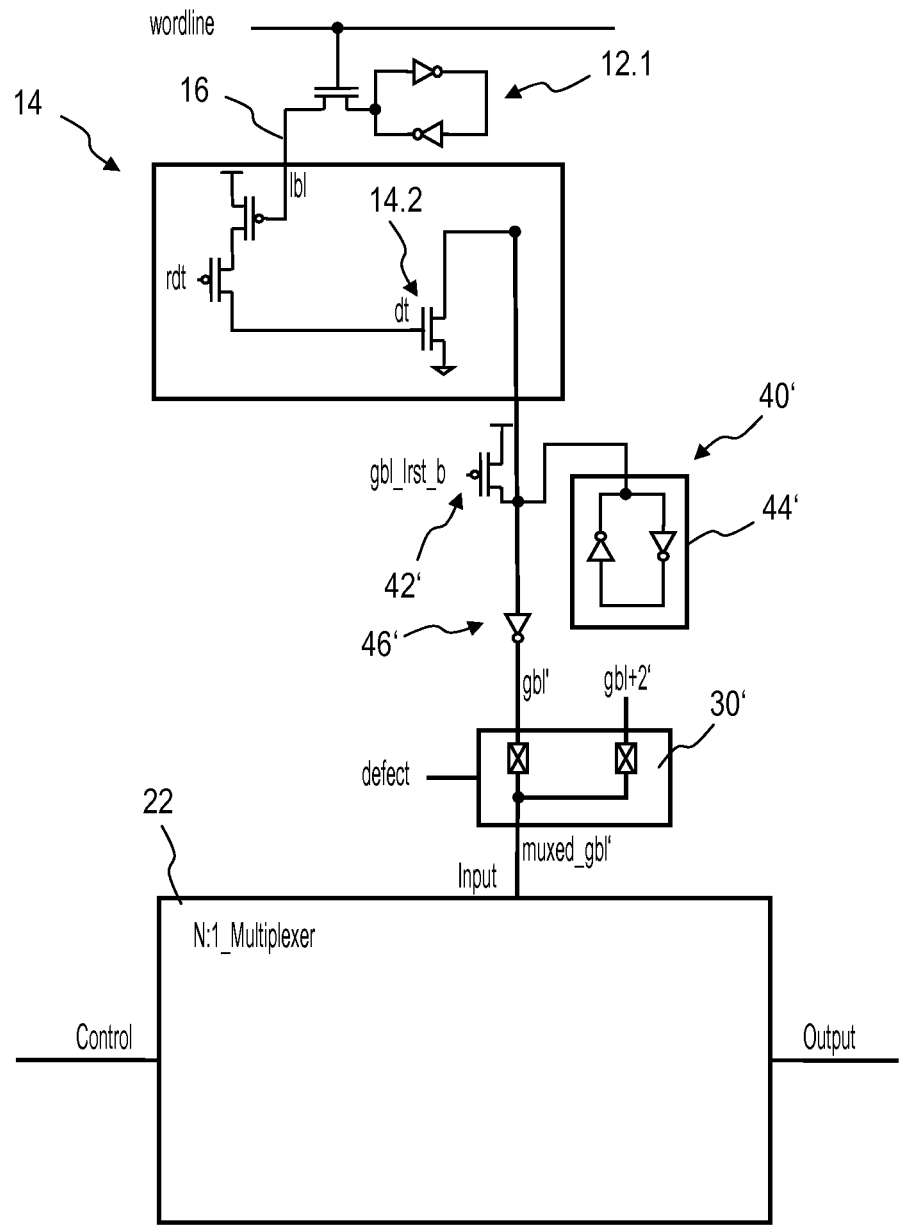
FIG. 5 is a schematic diagram of a read scheme of a SRAM cell of a SRAM array system, in accordance with an embodiment of the prior art.

FIG. 3 is a schematic diagram of a read scheme of a SRAM cell 12.1 of the SRAM array 1 shown in FIG. 1 or 2, in accordance with an embodiment of the present inventive subject matter. FIG. 4 is a schematic diagram of a circuit arrangement 30 for reducing the power consumption in an SRAM array system 1 shown in FIGS. 1 to 3, in accordance with an embodiment of the inventive subject matter.

Referring to FIG. 3, in the shown embodiment of the ripple domino read scheme of the SRAM cell 12.1, only the main components are shown in a schematic way. Generally a read operation starts with a rising word line at the SRAM cell 12.1. The SRAM cell 12.1 pulls down the local bit line (lbl) 16. The local bit line 16 is connected to the local evaluation circuit 14, which is shown in part and which acts as an amplifier for the read signal. Therefore, the local evaluation circuit 14 operates as an amplifier and a gate controlled by a read enable signal rdt. Also, the local evaluation circuit 14 comprises a pull-down-NFET 14.2 controlled by a signal dt to pull down a global bit line 18. The global bit line 18 is a high capacity node due to the long wiring length and the device capacitance of the local evaluation circuit pull-down devices. The global bit line 18 is the biggest contributor for active and passive power consumption in the depicted ripple domino SRAM arrays.

The SRAM cells 12.1 on the selected word line are all read out in spite of the fact that only the information of one set of SRAM cells is needed at the output. For a data cache using a given number of N global bit lines 18, only one of the N possible discharged global bit lines 18 is read out. A N:1-way multiplexer 22 chooses the global bit line 18 to read based on a control signal.

A circuit arrangement 30 for reducing power consumption in an SRAM cell array system is located to split the global bit line 18 in an upper part upper_gbl and a lower part lower_gbl. The circuit arrangement 30 is connected to the local evaluation circuit 14 by a first line gbl forming the upper part ("upper_gbl") of the split global bit line 18, and to the N:1-way multiplexer 22, which selects a set of SRAM cells 12.1 to read, by a second line muxed_gbl forming the lower part ("lower_gbl") of the split global bit line 18. The circuit arrangement 30 receives an early set prediction signal SP indicating whether an associated set of SRAM cells 12.1 in a SRAM cell bank 12 is to be read or won't be read. The circuit arrangement 30 performs at least one of the following in accordance with the early set prediction signal SP: 1) connecting the upper_gbl of the split global bit line 18 to the lower_gbl of the split global bit line 18 if the associated set of SRAM cells 12.1 is to be read; and 2) isolating the upper_gbl of the split global bit line 18 from the lower_gbl of the global bit line 18 if the associated set of SRAM cells 12.1 is not to be read.

In the shown embodiment, the circuit arrangement 30 is connected additionally to the local evaluation circuit 14 by a third line gbl+2 forming an alternative upper part of the split global bit line 18. The circuit arrangement 30 receives a defect signal indicating whether the first line gbl is found to be defective or is found to be not defective. So, the circuit arrangement 30 is used as redundancy multiplexer to decide which of the lines gbl and gbl+2 will form the upper part upper_gbl of the global bit line and connect to the lower part lower_gbl of the global bit line 18. and fed as input signal into the N:1-way multiplexer 22 based on the defect signal. The first line gbl is used as upper part upper_gbl of said split global bit line 18 if the first line gbl is found to be not defect; and the third line gbl+2 is used as the upper part upper_gbl of the split global bit line 18 if the first line gbl is found to be defective.

Further the global bit line restore and latch device 40 is arranged between the circuit arrangement 30 and the N:1-way multiplexer 22. The global bit line restore and latch device 40 is used to charge the global bit line 18 and comprises a pull-up-PFET 42, a latch 44, and an inverter 46.

Referring to FIG. 4, the circuit arrangement 30 for reducing power consumption comprises, for each of the lines gbl, gbl+2, a NFET 32, 34 as passgate devices used to connect/isolate the corresponding one of the lines gbl, gbl+2 as the upper part upper_gbl to/from the lower part lower_gbl of the split global bit line 18. The passgate devices 32, 34 are also used to decide which line, gbl or gbl+2, is used as the upper part upper_gbl of the global bit line 18. In FIG. 4, a first NFET 32 is used to connect or isolate the first line gbl as upper part upper_gbl of the split global bit line 18 to or from the second line muxed_gbl, which is the lower part lower_gbl of the split global bit line 18. The second NFET 34 is used as the second passgate device to connect or isolate the third line gbl+2, as the upper part upper_gbl of the split global bit line 18, to or from the second line muxed_gbl, which is the lower part lower_gbl of the split global bit line 18. The first NFET 32 is controlled by a first control signal Open_G1, and the second NFET 34 is controlled by a second control signal Open_G2. The first control signal Open_G1 and the second control signal Open_G2 are generated by logically combining the early set prediction signal SP and the defect signal. A possible solution of the signal generation is shown in FIG. 4 where two inverters and two NOR-Gates 31, 33 are used to generate the control signals Open_G1, Open_G2.

The shown implementation of the redundancy multiplexer 30 does not contain full transmission gates but only NFET-passgates 32, 34. The NFET-passgates 32, 34 allow active power saving at every precharge action as the first line gbl or the third line gbl+2 form the upper part of the global bit line 18 above the passgates 32, 34. Instead of being precharged to the full supply voltage Vdd, the upper part upper_gbl will only be precharged to voltage Vdd-Vt (Vt represents a threshold voltage), which is smaller than the supply voltage Vdd. This allows leakage reduction as the Drain-Source voltage of the global bit line pull-down devices 14.2 is reduced. This also allows a speed up of the SRAM read operation as discharge of the global bit line 18 will be faster if the voltage swing is reduced.

In some embodiments, a "Chicken Switch" option can be used. A Chicken Switch is depicted in FIG. 4 in dashed lines. The Chicken Switch option may be implemented to offer the possibility to fully precharge the global bit line 18 to the supply voltage level if desired. For this reason, two PFETs 36, 38 are implemented to build up a full transmission gate with the corresponding NFETs 32 and 34. The PFET 36 forms a full transmission gate with the NFET 32 to allow a full precharge of the first line gbl, when the first line gbl is selected as the upper part, upper_gbl, of the split global bit line 18. The PFET 38 forms a full transmission gate with the NFET 34 to allow a full precharge of the third line gbl+2, when the third line gbl+2 is selected as the upper part, upper_gbl, of the split global bit line 18. The PFET 36 is controlled by a third control signal Open_G1*, and the second PFET 38 is controlled by a fourth control signal Open_G2*. The third control signal Open_G1* is generated by logically combing the first control signal Open_G1 with a fifth control signal Enable_full_pchg. The signal Enable_full_pch represents an enable signal for enabling a full precharge of the global bit line 18. The fourth control signal Open_G2* is generated by logically combining the second control signal Open_G2 with the fifth control signal Enable_full_pchg. In some embodiments, two NAND-Gates 35, 37 can be used to generate the control signals OpenG1*, Open_G2*, as depicted in FIG. 4.

Embodiments of the inventive subject matter address the reduction of power consumption in an array of Static Random Access Memory (SRAM) cells. Splitting the global bit line and introducing the early set prediction signal containing information on whether the associated set of SRAM cells might be read, or won't be read allows reduction in the average global bit line power consumption by up to 40%.

Embodiments of the inventive subject matter may also combine a redundancy multiplexer function with a power saving feature for the global bit line. The power saving feature charges up a part of the global bit line, depending on the set prediction information and without additional requirements for the signals feeding into the N:1 way multiplexer to select a global bit line to read based on a late selecting signal.

What is claimed is:

1. A circuit that reduces power consumption in an array system of memory cells that are accessible in parallel, the circuit comprising:
a local evaluation circuit connected to a memory cell and a global bit line of the array system of memory cells;
a selection circuitry that splits the global bit line into an upper part and a lower part of the global bit line, the selection circuitry adapted to receive an early set prediction signal and to connect the upper part of the global bit line to the lower part of the global bit line based on the early set prediction signal, wherein the early set prediction signal indicates whether a set of memory cells, which include the memory cell, is being read; and
a N:1 multiplexer connected to the lower part of the global bit line to receive the lower part of the global bit line as input.

2. The circuit of claim 1, wherein the selection circuitry is also connected to a redundancy global bit line and further adapted to receive a defect signal, the selection circuitry adapted to connect either the upper part of the global bit line or the redundancy global bit line to the lower part of the global bit line in accordance with the defect signal and the early set prediction signal, wherein the defect signal indicates whether the global bit line is defective.

3. The circuit of claim 2, wherein the selection circuitry comprises:
a first negative field effect transistor (NFET) that is adapted to operate as a first passgate device to connect or disconnect the upper part of the global bit line to the lower part of the global bit line in accordance with a first control signal;
a second NFET that is adapted to operate as a second passgate device to connect or disconnect the redundancy global bit line to the lower part of the global bit line in accordance with a second control signal;
a first logic gate adapted to receive an inverted early set prediction signal and the defect signal, the first logic gate adapted to generate the first control signal based on the inverted early set prediction signal and the defect signal; and
a second logic gate adapted to receive the inverted early set prediction signal and an inverted defect signal, the second logic gate adapted to generate the second control signal based on the inverted early set prediction and the inverted defect signal.

4. The circuit of claim 3, wherein the selection circuitry further comprises:
a first inverter that is adapted to invert the early set prediction signal to generate the inverted early set prediction signal; and
a second inverter that is adapted to invert the defect signal to generate the inverted defect signal,
wherein the first logic gate comprises a first NOR gate adapted to receive the defect signal and the inverted early set prediction signal from the first inverter,
wherein the second logic gate comprises a second NOR gate adapted to receive the inverted defect signal from the second inverter and the inverted early set prediction signal from the first inverter.

5. The circuit of claim 2, wherein the selection circuitry further comprises:
a first full transmission gate connected to the upper part of the global bit line and adapted to receive a first control signal and a third control signal, wherein the first control signal and the third control signal control whether the upper part of the global bit line is connected by the first full transmission gate to the lower part of the global bit line;
a second full transmission gate connected to the redundancy global bit line and adapted to receive a second control signal and a fourth control signal, wherein the second control signal and the fourth control signal control whether the redundancy global bit line is connected by the second full transmission gate to the lower part of the global bit line;
a first logic gate adapted to receive an inverted early set prediction signal and the defect signal, the first logic gate adapted to generate the first control signal based on the inverted early set prediction signal and the defect signal;

a second logic gate adapted to receive the inverted early set prediction signal and an inverted defect signal, the second logic gate adapted to generate the second control signal based on the inverted early set prediction and the inverted defect signal;

a third logic gate adapted to receive the first control signal and an enable full precharge signal, the third logic gate adapted to generate the third control signal based on the first control signal and the enable full precharge signal, wherein the enable full precharge signal indicates whether full precharge of the upper part of the global bit line is enabled; and a fourth logic gate adapted to receive the second control signal and the enable full precharge signal, the fourth logic gate adapted to generate the fourth control signal based on the second control signal and the enable full precharge signal.

6. The circuit of claim 5 further comprising:
a first inverter that is adapted to invert the early set prediction signal to generate the inverted early set prediction signal; and
a second inverter that is adapted to invert the defect signal to generate the inverted defect signal,
wherein the first logic gate comprises a first NOR gate adapted to receive the defect signal and the inverted early set prediction signal from the first inverter,
wherein the second logic gate comprises a second NOR gate adapted to receive the inverted defect signal from the second inverter and the inverted early set prediction signal from the first inverter,
wherein the third logic gate comprises a third NOR gate connected to receive the first control signal from the first NOR gate and to receive the enable full precharge signal,
wherein the fourth logic gate comprises a fourth NOR gate connected to receive the second control signal from the second NOR gate and to receive the enable full precharge signal,
wherein a first negative field effect transistor (NFET) and a first positive field effect transistor (PFET) form the first full transmission gate,
wherein a second NFET and a second PFET form the second full transmission gate.

7. The circuit of claim 1 further comprising a global bit line restore and latch device adapted to charge the global bit line, the global bit line restore and latch device arranged between the selection circuitry and the N:1 multiplexer.

8. The circuit of claim 7, wherein the global bit line restore and latch device comprises a pull-up positive field effect transistor, a latch, and an inverter.

9. An array of memory cells that are accessible in parallel, the array of memory cells comprising:
a plurality of global bit lines;
for each of the plurality of global bit lines,
circuitry that splits the global bit line into an upper part and a lower part of the global bit line, the circuitry adapted to receive an early set prediction signal and to connect the upper part of the global bit line to the lower part of the global bit line based on the early set prediction signal, wherein the early set prediction signal indicates a set of memory cells to be read;
a global bit line restore and latch device adapted to charge the global bit line, the global bit line restore and latch device arranged between the circuitry and a N:1 multiplexer; and the N:1 multiplexer connected to the lower parts of the plurality of global bit lines and adapted to select from the plurality of global bit lines as input.

10. The array of memory cells of claim 9, wherein the circuitry comprises a passgate device adapted to receive the early set prediction signal and to connect the upper part of the global bit line to the lower part of the global bit line.

11. The array of memory cells of claim 9, wherein the global bit line restore and latch device comprises a pull-up positive field effect transistor, a latch, and an inverter.

12. The array of memory cells of claim 9 further comprising:
a plurality of redundancy global bit lines,
wherein the circuitry for each of the plurality of global bit lines is,
connected to a respective one of the plurality of redundancy global bit lines,
adapted to receive a defect signal and to connect either the upper part of the global bit line or the respective one of the plurality of redundancy global bit lines to the lower part of the global bit line in accordance with the defect signal and the early set prediction signal, wherein the defect signal indicates whether the global bit line is defective.

13. The array of memory cells of claim 12, wherein the circuitry comprises:
a first negative field effect transistor (NFET) that is adapted to operate as a first passgate device to connect or disconnect the upper part of the global bit line to the lower part of the global bit line in accordance with a first control signal;
a second NFET that is adapted to operate as a second passgate device to connect or disconnect the redundancy global bit line to the lower part of the global bit line in accordance with a second control signal;
a first logic gate adapted to receive an inverted early set prediction signal and the defect signal, the first logic gate adapted to generate the first control signal based on the inverted early set prediction signal and the defect signal; and
a second logic gate adapted to receive the inverted early set prediction signal and an inverted defect signal, the second logic gate adapted to generate the second control signal based on the inverted early set prediction and the inverted defect signal.

14. The array of memory cells of claim 13, wherein the circuitry further comprises:
a first inverter that is adapted to invert the early set prediction signal to generate the inverted early set prediction signal; and
a second inverter that is adapted to invert the defect signal to generate the inverted defect signal,
wherein the first logic gate comprises a first NOR gate adapted to receive the defect signal and the inverted early set prediction signal from the first inverter,
wherein the second logic gate comprises a second NOR gate adapted to receive the inverted defect signal from the second inverter and the inverted early set prediction signal from the first inverter.

15. The array of memory cells of claim 12, wherein the circuitry further comprises:
a first full transmission gate connected to the upper part of the global bit line and adapted to receive a first control signal and a third control signal, wherein the first control signal and the third control signal control whether the upper part of the global bit line is connected by the first full transmission gate to the lower part of the global bit line;

a second full transmission gate connected to the redundancy global bit line and adapted to receive a second control signal and a fourth control signal, wherein the second control signal and the fourth control signal control whether the redundancy global bit line is connected by the second full transmission gate to the lower part of the global bit line;

a first logic gate adapted to receive an inverted early set prediction signal and the defect signal, the first logic gate adapted to generate the first control signal based on the inverted early set prediction signal and the defect signal;

a second logic gate adapted to receive the inverted early set prediction signal and an inverted defect signal, the second logic gate adapted to generate the second control signal based on the inverted early set prediction and the inverted defect signal;

a third logic gate adapted to receive the first control signal and an enable full precharge signal, the third logic gate adapted to generate the third control signal based on the first control signal and the enable full precharge signal, wherein the enable full precharge signal indicates whether full precharge of the upper part of the global bit line is enabled; and a fourth logic gate adapted to receive the second control signal and the enable full precharge signal, the fourth logic gate adapted to generate the fourth control signal based on the second control signal and the enable full precharge signal.

16. The array of memory cells of claim 15 further comprising:

a first inverter that is adapted to invert the early set prediction signal to generate the inverted early set prediction signal; and a second inverter that is adapted to invert the defect signal to generate the inverted defect signal, wherein the first logic gate comprises a first NOR gate adapted to receive the defect signal and the inverted early set prediction signal from the first inverter, wherein the second logic gate comprises a second NOR gate adapted to receive the inverted defect signal from the second inverter and the inverted early set prediction signal from the first inverter, wherein the third logic gate comprises a third NOR gate connected to receive the first control signal from the first NOR gate and to receive the enable full precharge signal, wherein the fourth logic gate comprises a fourth NOR gate connected to receive the second control signal from the second NOR gate and to receive the enable full precharge signal, wherein a first negative field effect transistor (NFET) and a first positive field effect transistor (PFET) form the first full transmission gate, wherein a second NFET and a second PFET form the second full transmission gate.

17. The array of memory cells of claim 9, wherein a static random access memory comprises the array of memory cells.

18. The array of memory cells of claim 17, wherein the static random access memory is domino static random access memory.

19. A method of reducing power consumption in a memory device, the method comprising:

transmitting an early set prediction signal to a plurality of passgates of the memory device,
wherein the early set prediction signal indicates which set of a plurality of sets of memory cells will be read,
wherein each of the plurality of passgates split a respective one of a plurality of global bit lines into an upper part and a lower part;

for a set of global bit lines of the plurality of global bit lines, which are associated with the set of the plurality of sets of memory cells to be read in accordance with the early set prediction signal, connecting the upper parts of the set of global bit lines with the respective lower parts of the set of global bit lines; and for a remaining set of the plurality of global bit lines, which are not associated with the set of the plurality of sets of memory cells to be read in accordance with the early set prediction signal, isolating the upper parts of the remaining set of the plurality of global bit lines from the lower parts of the remaining set of the plurality of global bit lines.

20. The method of claim 17 further comprising:

precharging the lower parts and the upper parts of the set of global bit lines; and precharging the lower parts of the remaining set of global bit lines without precharging the upper parts of the remaining set of global bit lines.

* * * * *